United States Patent
Chen et al.

(10) Patent No.: US 7,099,739 B2
(45) Date of Patent: Aug. 29, 2006

(54) STOCKER UTILIZATION SELF-BALANCING SYSTEM AND METHOD

(75) Inventors: Yu-Chi Chen, Hsinchu (TW); Wei-Yu Lai, Hsinchu (TW); Yung-Chang Peng, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 139 days.

(21) Appl. No.: 10/731,533

(22) Filed: Dec. 9, 2003

(65) Prior Publication Data

US 2005/0125095 A1    Jun. 9, 2005

(51) Int. Cl.
*G06F 7/00* (2006.01)

(52) U.S. Cl. ............... 700/228; 700/112; 700/213; 414/806; 414/940

(58) Field of Classification Search ............... 700/213, 700/228, 112, 113, 121; 414/217, 806, 935, 414/940
See application file for complete search history.

(56) References Cited

U.S. PATENT DOCUMENTS

| | | | | |
|---|---|---|---|---|
| 6,012,894 A | * | 1/2000 | Watanabe et al. | 414/806 |
| 6,392,403 B1 | * | 5/2002 | Conboy et al. | 324/158.1 |
| 6,580,967 B1 | * | 6/2003 | Jevtic et al. | 700/228 |
| 6,618,639 B1 | * | 9/2003 | Nakashima | 700/109 |
| 6,622,057 B1 | * | 9/2003 | Ko et al. | 700/113 |
| 6,662,076 B1 | * | 12/2003 | Conboy et al. | 700/214 |
| 6,733,243 B1 | * | 5/2004 | Ogata et al. | 414/217 |
| 6,778,879 B1 | * | 8/2004 | Chang et al. | 700/223 |
| 6,854,583 B1 | * | 2/2005 | Horn | 198/348 |

* cited by examiner

*Primary Examiner*—Khoi H. Tran
(74) *Attorney, Agent, or Firm*—Duane Morris LLP

(57) ABSTRACT

A method for operating a plurality of stockers, comprises the steps of: monitoring utilization of the plurality of stockers, each stocker capable of storing a plurality of wafer, LCD or reticle containers; and automatically transferring a first wafer, LCD or reticle container from a first one of the stockers to a second one of the stockers if the utilization of the first stocker is greater than a predetermined thereshold.

21 Claims, 3 Drawing Sheets

STOCKER UTILIZATION SELF-BALANCING SYSTEM AND METHOD

FIELD OF THE INVENTION

The present invention relates to control systems generally, and more specifically to a control method and system for stockers in an automated material handling system (AMHS).

BACKGROUND

AMHS's have been used extensively in the semiconductor fabrication field. The typical system includes a plurality of bays (rows) of storage areas. Each bay has a stocker, which includes bins for holding a plurality of containers, such as standard mechanical interface (SMIF) containers for loading 200 mm (8 inch) wafers, or front opening unified pods (FOUPs), which may be used to load 300 mm (12 inch) wafers. The stocker holds the SMIFs or FOUPs in preparation for transporting a SMIF or FOUP to the loadport of a processing tool. An overhead hoist transport (OHT) associated with each bay transports the SMIF or FOUP with wafers from the stocker to a loadport for processing in one of the tools (fabrication process machines).

Because the availability of wafers to process at the time the equipment is ready to perform the processing has a major impact on the overall production rate, it is important to operate the AMHS in a manner that supplies wafers quickly as soon as they are needed. A frequently used measure of the AMHS performance is the Operator Service Time (OST). The OST is an efficiency index of the AMHS that measures the period of time between issuance of a retrieval command for a lot of wafers (by the load port of the processing tool) and the time when the wafers are available to the operator at the tool. Two significant components of the OST include: (1) the stocker output port time, which is the period between issuance of a retrieval command by the load port of the processing tool and the time when the wafers are transferred to the stocker output port, and (2) the tool load port time, which is the period between issuance of a retrieval command by the load port of the processing tool and the time when the wafers are transferred to the load port of the equipment.

OST is heavily influenced by the way in which the stockers are controlled. One aspect of stocker control is the way in which the utilization of each stocker was managed. If one stocker has all of its bins full, while another stocker is empty, then the stockers cannot efficiently supply wafers when they are needed, and processing will be delayed. High stocker utilization leads to low stocker hit ratio (i.e., the wafers are less likely to be stored in the stocker nearest the tool where they are needed). This results in greater OST, reducing the tool efficiency (because the tool cannot be used 100% of the time when it is not constantly supplied with wafers).

Typically, when the utilization of the stocker exceeded a maximum utilization specification, an alarm system sent a message to an on-duty operator. The on-duty operator would trigger a command to move one or more appropriate FOUPs using an materials control system (MCS) server graphical user interface (GUI), until the utilization again was within the specification. One or more FOUPs would be moved from the stocker with excess utilization to a stocker with lower utilization. The on-duty operator required time to decide which FOUPs to move, and to which destination stocker the FOUPs should be relocated. Thus, balancing the stocker utilization manually required time and manpower.

It would be desirable to provide a method and system that improves the stocker output port time, and thus improves the OST.

SUMMARY OF THE INVENTION

An automated material handling system comprises a plurality of stockers. Each stocker is capable of storing a plurality of wafer, LCD or reticle containers. A means is provided for monitoring utilization of the plurality of stockers. A control means causes automatic transfer of a first wafer, LCD or reticle container from a first one of the stockers to a second one of the stockers if the utilization of the first stocker is greater than a predetermined thereshold.

A method for operating a plurality of stockers comprises the steps of: monitoring utilization of the plurality of stockers, each stocker capable of storing a plurality of wafer, LCD or reticle containers; and automatically transferring a first wafer, LCD or reticle container from a first one of the stockers to a second one of the stockers if the utilization of the first stocker is greater than a predetermined thereshold.

DETAILED DESCRIPTION

The following terms are used below:

Bin utilization of stocker (BUS)—the percentage of bins in a stocker currently in use, given by:

BUS=100×(No. of bins used in the stocker)/(Total No. of bins in stocker)

Stocker hit rate (SHR)—the probability that the wafers are stored in a stocker that is located at the bay where the wafers are to be processed next.

SHR=(No. of retrieval commands where wafers are stored in a stocker located at the bay where the wafers are to be processed)/(total number of retrieval commands).

In order to control the AMHS effectively, an automated control system can be used to control storage of the FOUPs and/or SMIFs in the stockers to avoid the situation of a FOUP/SMIF being missing when requested for a particular tool. If the quantity of FOUPs/SMIFs in a stocker becomes too high, (i.e., the BUS for those stockers becomes too high, the automated control system can balance the loading of the stockers 102, 104 to avoid a "stocker crash". The control system can automatically balance BUS for the stockers, find an appropriate destination stocker for each FOUP to be moved, and set up a BUS specification flexibly.

Figure 1:
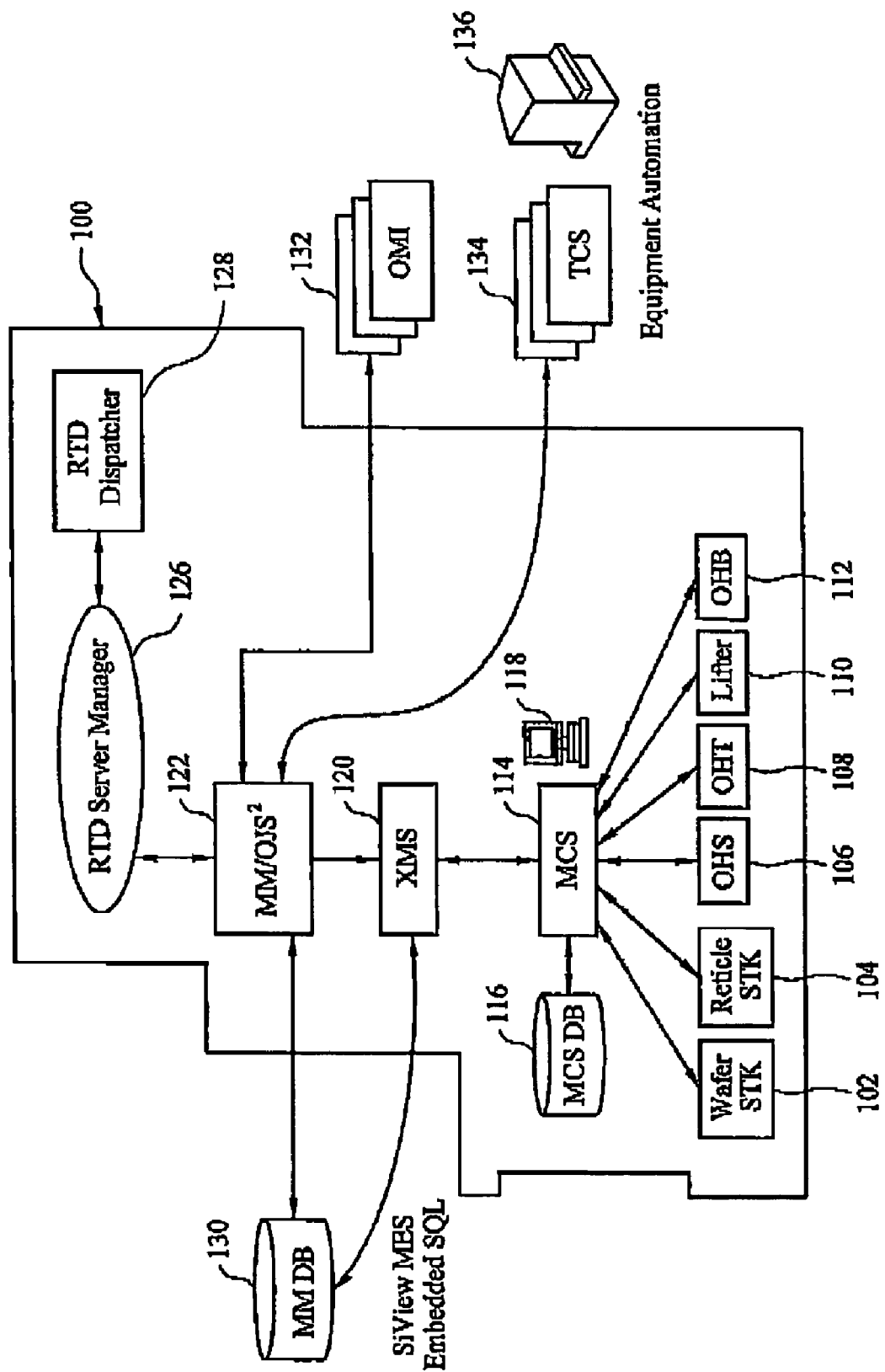
FIG. 1 is a block diagram of an exemplary AMHS including a stocker utilization self-balancing system.

FIG. 1 is a block diagram of an exemplary AMHS 100. The AMHS 100 includes a plurality of stockers, such as one or more wafer stockers 102 and one or more reticle stockers 104. Stockers may also contain liquid crystal display substrates (not shown). Each stocker 102, 104 is capable of storing a plurality of wafer (or reticle) containers. The transport conveyor system in the AMHS 100 includes the overhead transport(s) (OHT) 108 with the overhead shuttle(s) 106. The stockers 102, 104 store lots of wafers and reticles for processing by tools 136. At least one lifter 110 lifts and loads SMIFs and/or FOUPs (collectively referred to herein as containers) from the stocker into the OHT 108.

OHB 112 acts as a loadport. A lot can be placed temporarily in the OHB 112 while all loadports are occupied. The OHB is close to the tool. The next lot may be taken from OHB 112 instead of from the stocker 102, reducing the time required for delivery. Overhead transports (OHT) 108 convey the lots of wafers and reticles between the stockers 102, 104 and the loadports of tools 136. The main (interbay) OHT 108 exchanges SMIFs and/or FOUPs 102, 104 with the intrabay OHTs. Each intrabay OHT may handle containers for a respective stocker 102, 104. A plurality of overhead hoist vehicle controllers (OHVCs) (not shown) provide the interface between the control software of the Material Control System (MCS) 114 and the hardware of the OHTs. The MCS 118 has an operator console 118, which may be, for example, a desktop or laptop computer or workstation, and a database 116, which stores all of the control parameters input by the system administrator. The OHVCs act as special purpose process controllers for this purpose. A local area network (LAN) such as an Ethernet LAN connects the MCS 114 and the OHCVs. A transfer management system (XMS) 120 operates at an application level to control the sequence of the commands performed by the AMHS. XMS 120 may be connected to the MCS 114 by another LAN. A user interface is provided by manufacturing management/operation job supervisor (MM/OJS) software 122. MM/OJS 122 interacts with the XMS 120 and a real-time server manager 126, which controls a real-time dispatcher (RTD) 128. The rule is provided into the RTD(Real Time Dispatcher) server, to decide which lot should be processed first. That arranges the lot-to-lot sequence. MM/OJS 122 is supported by an operation management interface (OMI) 132, and includes a material management database MM DB 130. XMS 120 uses the MM DB 130 in conjunction with a manufacturing execution system. MM/OJS 122 also interacts with the tool control system 134 that monitors and controls the equipment 136.

Figure 2:
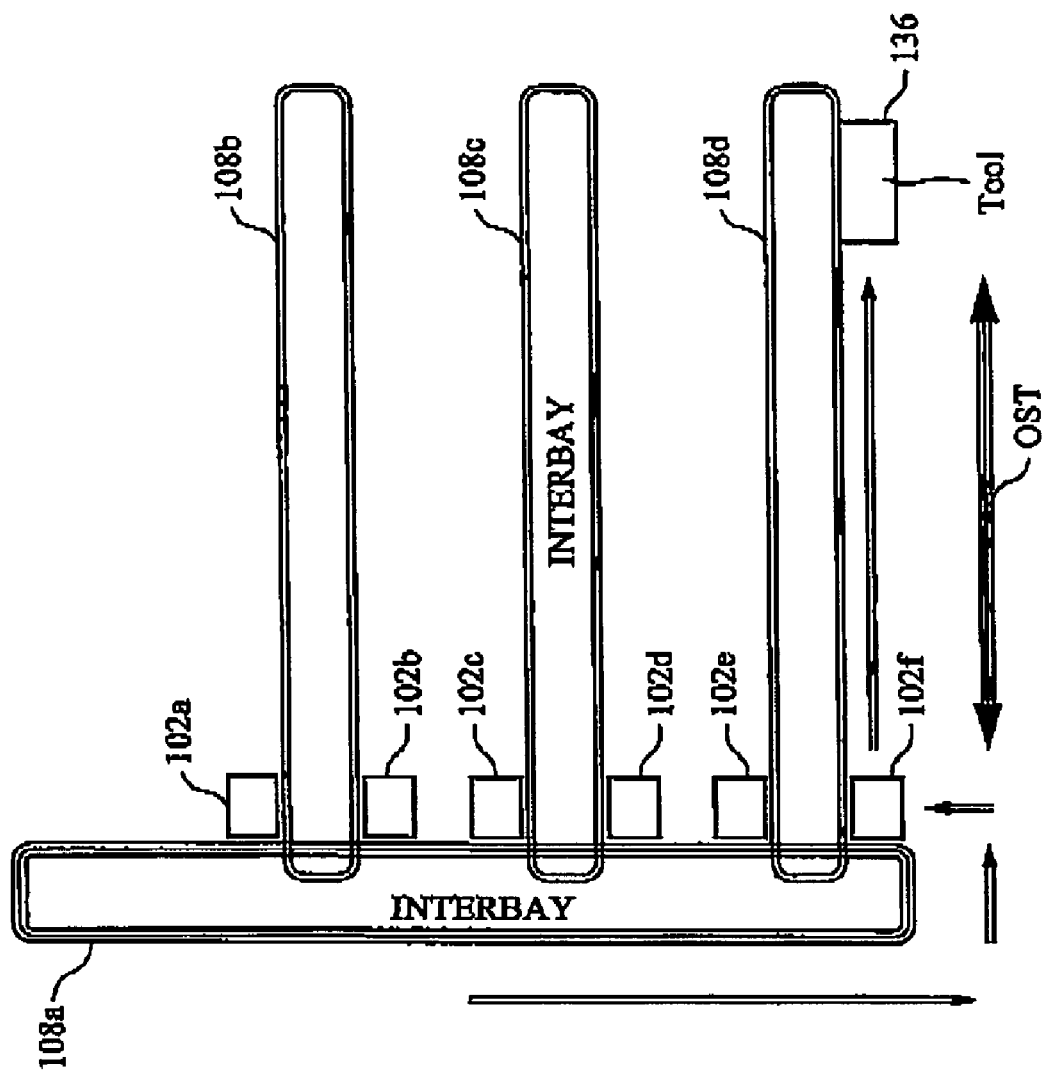
FIG. 2 is a diagram of an overhead transport and a plurality of stockers within the system of FIG. 1.

FIG. 2 is a simplified plan diagram of a few hardware components of the system. The OHT system 108 includes an interbay transport 108a and a plurality of intrabay transports 108b–108d arranged perpendicularly to the interbay transport 108a. Each of the OHTs 108a–108d rotates in a carousel fashion. A plurality of stockers 102a–102f are arranged at ends of the intrabay OHTs 108b–108d, proximate to the interbay transport 108a. Although only one tool 136 is shown, each bay may have one or more corresponding tools. Although only the wafer stockers 102 are shown, reticle stockers 104 may also be included. The OHT system 108 provides transportation between any of the stockers 102, 104 and any of the tools 136. An arrow labeled OST indicates the time delay between a retrieve command and the availability of a lot of wafers (or reticles) to the operator.

Figure 3:
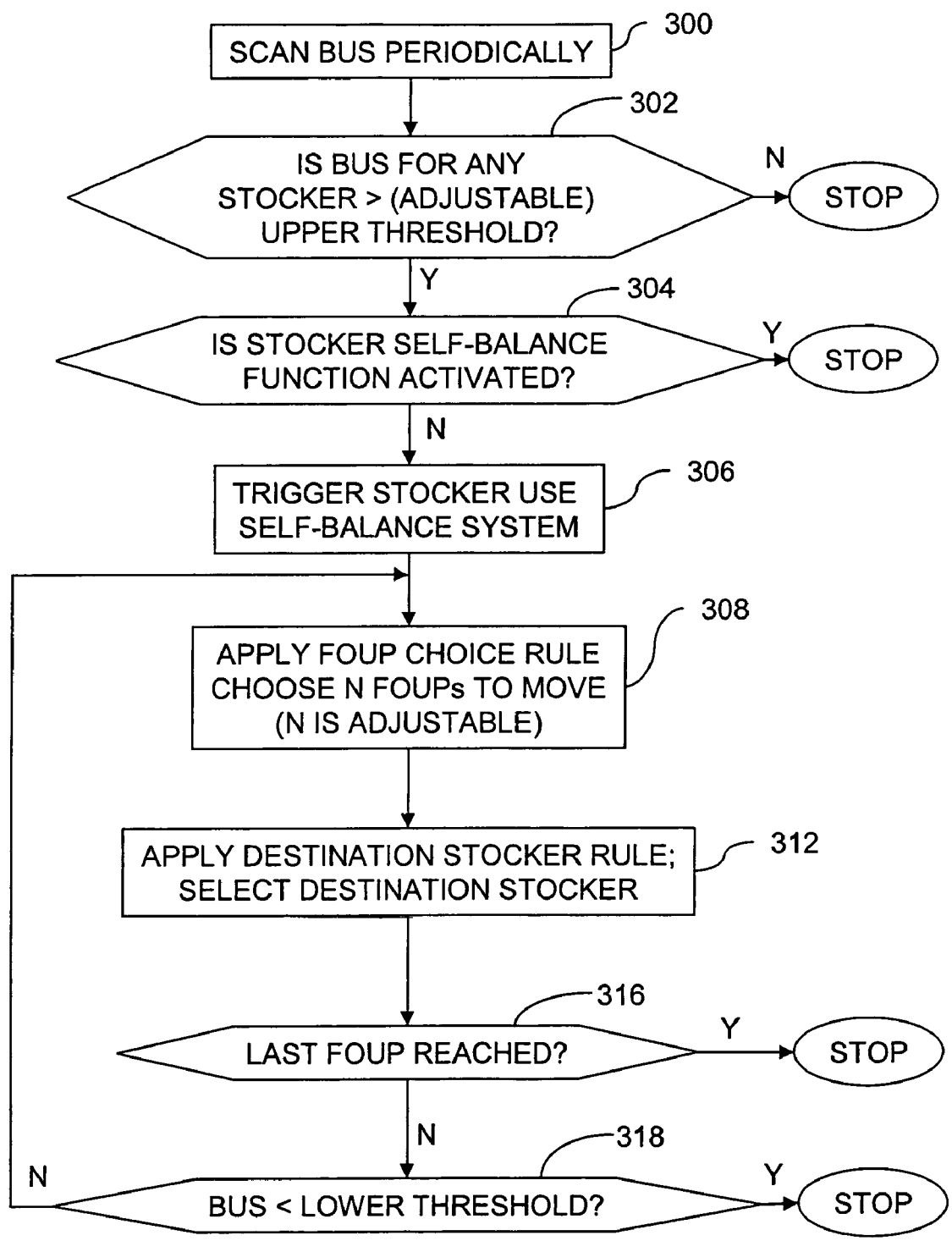
FIG. 3 is a flow chart diagram of a method for self-balancing utilization of a plurality of stockers.

FIG. 3 is a flow chart of an exemplary method for operating a plurality of stockers.

At step 300, for each stocker, the MM/OJS server 122 scans the BUS of the stocker periodically to monitor the utilization of the plurality of stockers.

At step 302, a determination is made whether the BUS for any stocker is greater than a predetermined adjustable upper (trigger) threshold. If none of the stocker utilizations is above the threshold, then the stocker utilization self-balance (SUSB) system is terminated until the next time step 300 is executed. If, however, the BUS of at least one stocker is greater than the upper (trigger) threshold, then step 304 is executed. For example, the MM/OJS server 122 can trigger the MCS server 114 to move one or more FOUPs until the BUS no longer exceeds the target BUS specification.

At step 304, if the SUSB system is already activated, no further action need be taken. If the SUSB function is not activated, then step 306 is performed.

At step 306, the SUSB system is triggered.

At step 308, the MM/OJS server 122 applies a FOUP (or SMIF) choice rule to identify the container(s) within the first stocker (having excess utilization) that are to be relocated to a second stocker. Preferably, the FOUP choice rule does not substantially reduce the SHR. That is, an ideal FOUP choice rule would relocate wafers/reticles that are least likely to be needed immediately for processing by the tool located proximate to the stocker from which the wafers/reticles were removed. A number of FOUP choice rules can be used to try to approach the ideal result.

In some embodiments, the FOUP choice rule is based on the lot type. A first wafer container (to be moved from a first stocker to a second stocker) is automatically selected from a plurality of wafer containers in the first stocker based on a type of wafer lot contained within the each wafer container stored in the first stocker. For example, the containers may be divided into a plurality of types, including engineering lot containers, production lot containers, control wafer containers, and empty containers. The engineering lots may include wafers used for R&D purposes, or for trouble shooting. Control wafers are wafers with known standard test patterns that are passed through the same process as the production wafers, to calibrate the process and help identify the cause of any observed artifacts in the production wafers. In some embodiments, the plurality of types are prioritized so that empty containers are moved out of the first stocker before control wafer containers, control wafer containers are moved out of the first stocker before production lot containers, and production lot containers are moved out of the first stocker before engineering lot containers. In other embodiments, the lot types may be divided out differently, and/or the prioritization of the various lot types may vary.

In other embodiments, the FOUP choice rule may be based on the reason that the lots were placed in the stocker. For example, some lots of wafers are banked (i.e., partially processed wafers are stored in the stocker until a customer orders products, and then the processing of the wafers is completed), and other lots of wafers are put on hold (i.e., during an experiment, an equipment problem prevents completion of the process until the equipment is corrected, or a tool is temporarily unavailable, and the wafers are stored in the stocker until the equipment is available to complete processing.).

In further embodiments, the FOUP choice may be made based on the length of time that a lot of wafers has been stored in the stocker. For example, a first-in, first-out (FIFO) rule may be used to choose the FOUPs that have been in the stocker longest. A last-in, first-out (LIFO) rule may be used, but is less preferred.

Although three examples of FOUP choice rules are described above, other FOUP choice rules may be used.

In other embodiments, more than one FOUP choice rule can be combined to determine the order in which FOUPs are moved. For example, the FOUPs may be grouped by type, as described above, and within each type, the individual FOUPs may be ordered based on the FIFO rule to determine which individual FOUP to relocate first. As another example, on-hold wafers may be relocated before banked wafers, and the on-hold wafer lots to be relocated may be ordered by type to determine which individual FOUPs to relocate first.

The number N of FOUPs (or SMIFs) to be moved is chosen based on the application of the rule in step 308. The number N may be adjusted by the operator, using the MM/OJS 122 interface. The list of selected FOUPs is passed to the MCS server 114.

At step 312, the MM/OJS server 122 applies a destination stocker selection rule to determine the second stocker to which containers are to be moved.

A variety of destination stocker selection rules may be used. For example, in some embodiments, a stocker may only be selected as the destination if the utilization BUS of the destination stocker is lower than a predetermined utilization (Ud) of that stocker.

In some embodiments, a stocker may be designated as the default destination stocker. For example in some implementations, the default destination stocker can be identified by assigning a destination priority setting to each stocker, and assigning a predetermined destination priority setting to the default destination stocker. In some examples, the default destination stocker is located so that there is a relatively short time to retrieve the wafers from the default destination stocker to be processed by the tools in any of the bays. There can be more than one default destination stocker. The destination stockers may have respectively different priority settings, so that a first destination stocker is used, if available; a second destination stocker is used if the first destination stocker is unavailable; and a third destination stocker is used if the first and second destination stockers are both unavailable.

In other embodiments, each stocker may have a designated alternate stocker, so that the containers are moved between each stocker and its alternate stocker. If the BUS of the alternate stocker becomes greater than the trigger threshold, then some FOUPs may move from the alternate stocker back to the corresponding primary stocker. Using a designated alternate for each stocker can help make the retrieval time more predictable when a lot of wafers is to be moved from the destination stocker to a processing tool.

In still other embodiments, the container is moved to the stocker having the lowest utilization of all the stockers at the time that a container is to be moved.

At step 316, if the last FOUP in the first stocker has been checked (to decide whether to relocate the FOUP), then the SUSB execution is completed. Otherwise, step 318 is performed.

At step 318, a check is made whether the BUS of the first stocker (from which the FOUPs are being relocated) is below a lower threshold. If the BUS of the first stocker is now below the lower threshold, then the SUSB execution is completed. Otherwise the loop of steps 308 to 318 is repeated until either all of the FOUPs have been evaluated as candidates to be moved, or the BUS of the stocker is below the lower threshold.

In some embodiments, a table in the MM DB 130 stores a respective set of parameter values for each stocker. The stockers can be assigned different parameters. Table 1 gives an example of an SUSB setting table.

As noted above, different stockers may be scanned with different frequency. Stockers may have different trigger thresholds Ut for initiating the SUSB function. Also, stockers may have different lower thresholds $U_L$ for terminating the SUSB operation. Further the stockers may have different thresholds Ud for allowing use as a destination. The number N of FOUPs to be transferred during an SUSB operation can be set independently for each stocker. The table shows that stocker NISK 37 is the number 1 default destination stocker, stocker NISK 38 is the number 2 default destination stocker, and stocker NISK 36 is the number 3 default destination stocker. Lastly, the alternate stocker active column can be used to determine whether a stocker should be used as an alternate stocker. If the alternate stocker option is selected, the identification of which destination stocker is the designated alternate is stored in the MCS server 114 during system parameter configuration (or in an update to the system parameter configuration).

It is advantageous to have a higher trigger threshold Ut to start the SUSB execution and a lower threshold $U_L$ to terminate the SUSB execution. This provides hysteresis in the system. If the same trigger threshold Ut that starts SUSB operation is used as a lower threshold $U_L$ for terminating the SUSB operation, then every time a new FOUP is moved to the first stocker, the SUSB will move a FOUP out of the same stocker. By setting a separate lower threshold, this constant movement of FOUPs is avoided. Instead enough FOUPs are removed from the first stocker so that it can receive a predetermined number of additional FOUPs without triggering the SUSB system again. For example, in Table 1, the group of stockers from NESK05 to NESK08 have Ut=80% and $U_L$=70%. This allows relocation of up to 10 FOUPs from one of these stockers before the SUSB is terminated.

Further, in preferred embodiments, the threshold Ud for being a receiving destination stocker is set lower (for all stockers) than the lowest value $U_L$ of any of the stockers. If $U_L$ of a first stocker were less than Ud of a second stocker, then it would be possible for the system to automatically transfer FOUPs from the first stocker to the second stocker, even when the first stocker has lower utilization than the second stocker. By keeping the lowest $U_L$ value larger than the highest Ud value, the system can ensure that the SUSB operation always terminates while the utilization of the source stocker is greater than the utilization of the destination stocker.

Although an example is described with respect to FOUPs for storing wafers, the techniques described above may also be applied to other workpieces, such as liquid crystal displays (LCDs) and reticles used for photolithographic processes.

Although the invention has been described in terms of exemplary embodiments, it is not limited thereto. Rather, the

TABLE 1

| Stocker ID | Active | Period (min.) | Trigger Ut (%) | Lower Utilization $U_L$ (%) | Destination Utilization Ud (%) | X' fer count N | Destination Priority | Alternate Stocker Active |
|---|---|---|---|---|---|---|---|---|
| NESK05 |   | 80 | 60 | 70 | 65 | 5 |   | X |
| NESK06 | X | 80 | 60 | 70 | 65 | 5 |   | X |
| NESK07 |   | 80 | 60 | 70 | 65 | 5 |   | X |
| NESK08 | X | 80 | 60 | 70 | 65 | 5 |   |   |
| NISK36 |   | 95 | 120 | 90 | 85 | 5 | 3 |   |
| NISK37 |   | 95 | 120 | 90 | 85 | 5 | 1 |   |
| NISK38 |   | 95 | 120 | 90 | 85 | 5 | 2 |   | appended claims should be construed broadly, to include other variants and embodiments of the invention, which may be made by those skilled in the art without departing from the scope and range of equivalents of the invention.

What is claimed is:

1. A method for operating a plurality of stockers, comprising the steps of:
    monitoring utilization of the plurality of stockers, each stocker capable of storing a plurality of wafer, LCD or reticle containers having a plurality of priorities; and
    automatically transferring a first wafer, LCD or reticle container from a first one of the stockers to a second one of the stockers if the utilization of the first stocker is greater than a predetermined thereshold, wherein one of the wafer, LCD or reticle containers having a high priority is moved out of the first stocker before one of the wafer, LCD or reticle containers having a lower priority,
    wherein the wafer, LCD or reticle containers comprising engineering lot containers, production lot containers, control wafer containers and empty containers and
    wherein a priority of the empty containers is higher than a priority of the control wafer containers, the priority of the control wafer containers is higher than a priority of the production wafer containers, and the priority of the production wafer containers is higher than a priority of the engineering lot containers.

2. The method of claim 1, wherein the first wafer, LCD or reticle container is automatically selected from a plurality of wafer, LCD or reticle containers based on a reason for placing the first wafer, LCD or reticle container in the stocker.

3. The method of claim 2, wherein:
    a first plurality of wafer containers contain wafer lots that are being stored between fabrication processes until required to fill an order,
    a second plurality of wafer containers contain wafer lots that are to be processed in equipment that is currently unavailable; and
    wafer containers from the second plurality of containers are selected to be moved before. wafer containers from the first plurality of wafers.

4. The method of claim 1, wherein the first wafer, LCD or reticle container selected based on a respective length of time that each wafer, LCD or reticle container has been stored in the first stocker.

5. The method of claim 1, wherein the second stocker is automatically selected based on a priority assigned to each stocker.

6. The method of claim 1, wherein the second stocker is automatically selected based on a utilization of each stocker.

7. The method of claim 1, wherein the second stocker is automatically selected from one of the group consisting of a primary destination stocker and an alternate destination stocker.

8. An automated material handling system, comprising:
    a plurality of stockers, each stocker capable of storing a plurality of wafer, LCD or ret containers having a plurality of priorities; and
    means for monitoring utilization of the plurality of stockers;
    control means for causing automatic transfer of a first wafer, LCD or reticle container from a first one of the stockers to a second one of the stockers if the utilization of the first stockers is greater than a predetermined thereshold, wherein one of the wafer, LCD or reticle container having a high priority is moved out of the first stocker before one of the wafer, LCD or reticle containers having a lower priority,
    wherein the wafer. LCD or reticle containers comprising engineering lot containers. production lot containers, control wafer, containers and empty containers, and
    wherein a priority of the empty containers is higher than a priority of the control wafer containers, the priority of the control wafer containers is higher than a priority of the production wafer containers, and the priority of the production wafer containers is higher than a priority of the engineering lot containers.

9. The system of claim 8, wherein the first wafer, LCD or reticle container is automatically selected from a plurality of wafer, LCD or reticle containers based on a reason for placing the first wafer, LCD or reticle container in the stocker.

10. The system of claim 9, wherein:
    a first plurality of wafer containers contain wafer lots that are being stored between fabrication processes until required to fill an order,
    a second plurality of wafer containers contain wafer lots that are to be processed in equipment that is currently unavailable; and
    wafer containers from the second plurality of containers are selected to be moved before wafer containers from the first plurality of wafers.

11. The system of claim 8, wherein the first wafer, LCD or reticle container is selected based on a respective length of time that each wafer, LCD or reticle container has been stored in the first stocker.

12. The system of claim 8, wherein the second stocker is automatically selected based on a priority assigned to each stocker.

13. The system of claim 8, wherein the second stocker is automatically selected based on a utilization of each stocker.

14. The system of claim 8, wherein the second stocker is automatically selected from one of the group consisting of a primary destination stocker and an alternate destination stocker.

15. A computer readable medium encoded with computer program code, wherein when the computer program code is executed by a processor, the processor performs a method for operating a plurality of stockers, comprising the steps of:
    monitoring utilization of the plurality of stockers, each stocker capable of storing a plurality of wafer, LCD or reticle containers having a plurality of priorities; and
    automatically transferring a first wafer, LCD or reticle container from a first one of the stockers to a second one of the stockers if the utilization of the first stocker is greater than a predetermined thereshold, wherein one of the wafer, LCD or reticle containers having a high priority is moved out of the first stocker before one of the wafer, LCD or reticle containers having a lower priority,
    wherein the wafer, LCD or reticle containers comprising engineering lot containers, production lot containers, control wafer containers and empty containers, and
    wherein a priority of the empty containers is higher than a priority of the control wafer containers, the priority of the control wafer containers is higher than a priority of The production wafer containers, and the priority of the production wafer containers is higher than a priority of the engineering lot containers.

16. The computer readable medium of claim 15, wherein the first wafer, LCD or reticle container is automatically selected from a plurality of wafer, LCD or reticle containers based on a reason for placing the first wafer, LCD or reticle container in the stocker.

17. The computer readable medium of claim 16, wherein:
a first plurality of wafer containers contain wafer lots that are being stored between fabrication processes until required to fill an order,
a second plurality of wafer containers contain wafer lots that are to be processed in equipment that is currently unavailable; and
wafer containers from the second plurality of containers are selected to be moved before wafer containers from the first plurality of wafers.

18. The computer readable medium of claim 15, wherein the first wafer, LCD or reticle container is selected based on a respective length of time that each wafer, LCD or reticle container has been stored in the first stocker.

19. The computer readable medium of claim 15, wherein the second stocker is automatically selected based on a priority assigned to each stocker.

20. The computer readable medium of claim 15, wherein the second stocker is automatically selected based on a utilization of each stocker.

21. The computer readable medium of claim 15, wherein the second stocker is automatically selected from one of the group consisting of a primary destination stocker and an alternate destination stocker.

* * * * *

UNITED STATES PATENT AND TRADEMARK OFFICE
CERTIFICATE OF CORRECTION

PATENT NO. : 7,099,739 B2 Page 1 of 1
APPLICATION NO. : 10/731533
DATED : August 29, 2006
INVENTOR(S) : Chen et al.

It is certified that error appears in the above-identified patent and that said Letters Patent is hereby corrected as shown below:

Column 7, line 58 of claim 8, "ret" should be changed to --reticle--.
Column 7, line 65 of claim 8, "stockers" should be changed to --stocker--.
Column 7, line 67 of claim 8, "container" should be changed to --containers--.

Signed and Sealed this

Tenth Day of April, 2007

JON W. DUDAS
*Director of the United States Patent and Trademark Office*